United States Patent [19]

Kishimoto et al.

[11] Patent Number: 4,978,224
[45] Date of Patent: Dec. 18, 1990

[54] METHOD OF AND APPARATUS FOR INSPECTING MOUNTING OF CHIP COMPONENTS

[75] Inventors: Shin Kishimoto, Osaka; Toshihide Morimoto, Nara; Nobuaki Kakimori, Nara; Yuho Takahashi, Nara; Morihide Ohsaki, Nara, all of Japan

[73] Assignee: Sharp Kabushiki Kaisha, Osaka, Japan

[21] Appl. No.: 218,311

[22] Filed: Jul. 12, 1988

[30] Foreign Application Priority Data

| Jul. 14, 1987 | [JP] | Japan | 62-175224 |
| Jul. 14, 1987 | [JP] | Japan | 62-175225 |
| Sep. 30, 1987 | [JP] | Japan | 62-246657 |
| Dec. 18, 1987 | [JP] | Japan | 62-322086 |
| Dec. 22, 1987 | [JP] | Japan | 62-326061 |

[51] Int. Cl.$^5$ ............................................. G01B 11/00
[52] U.S. Cl. .................................. 356/394; 356/372; 364/552
[58] Field of Search ............... 356/394, 372, 376, 398; 364/552; 382/8

[56] References Cited

U.S. PATENT DOCUMENTS

| 4,578,810 | 3/1986 | MacFarlane et al. | 356/394 |
| 4,692,690 | 9/1987 | Hara et al. | 356/394 |
| 4,728,195 | 3/1988 | Silver | 356/394 |
| 4,799,175 | 1/1989 | Sano et al. | 356/94 |

OTHER PUBLICATIONS

Y. Kakinoki, et al., "Loaded Printed Circuit Board Inspection with 3-D Measurement of Component Orientation", (Institute of Electronic Information and Communication Engineers), PRL85-34, pp. 67-75.

Cheng; "Design for an Automated Recognition System for Multilayer Circuit Board Testing"; SPIE, vol. 255, Practical Electro-Optical Inst. and Techniques (1980) pp. 40-42.

T. Masaki, et al., "Solder Inspection System for Surface Mount Board", Pros. Spring (1988) General Meeting Institute of Electronic Information and Communication Engineers, pp. 2-247.

Primary Examiner—Léon Scott, Jr.
Attorney, Agent, or Firm—Flehr, Hohbach, Test, Albritton & Herbert

[57] ABSTRACT

To determine whether chip components are properly mounted on a printed circuit board, two sets of slit light beams for projecting slit line images in mutually perpendicular directions are alternately made incident thereon diagonally from above. Edges of the mounted chip components produce discontinuities in the projected slit beam image patterns such that the positions, sizes, orientations, etc. of individual mounted components can be calculated from image data obtained from viewing positions above the circuit board by a camera or the like. Since it can be easily ascertained how the slit line image pattern should appear if proper components are properly mounted, an analysis of the calculated data can indicate whether the chip components are properly mounted on the tested printed circuit board.

10 Claims, 17 Drawing Sheets

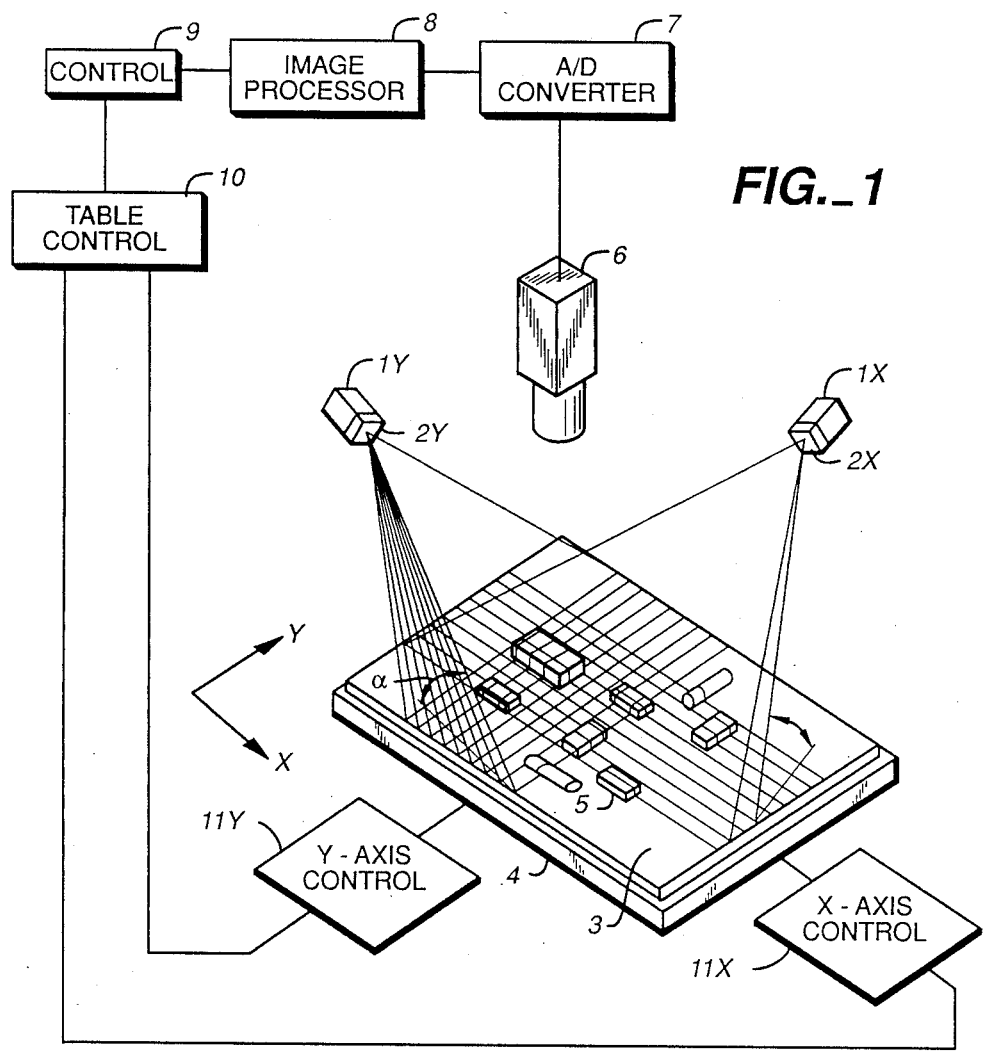
FIG._1
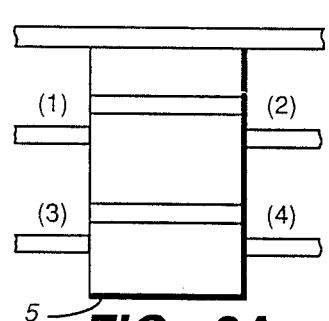
FIG._2A
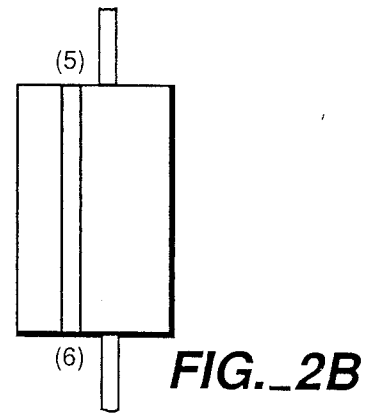
FIG._2B

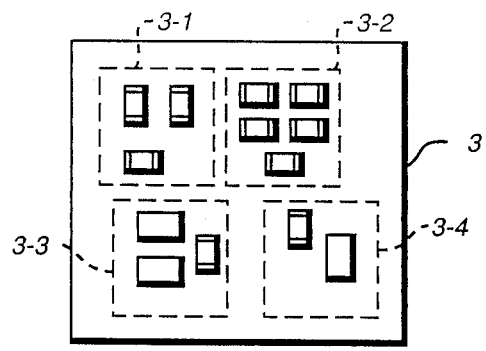
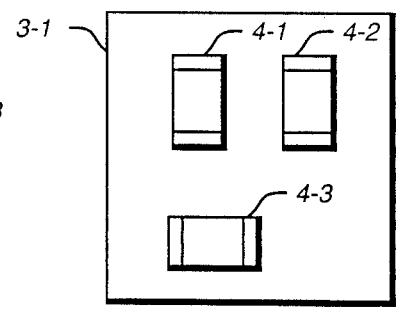
FIG._3  FIG._4
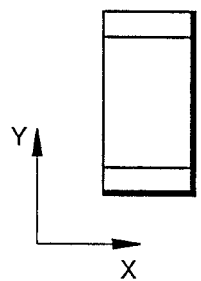
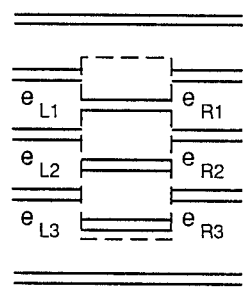
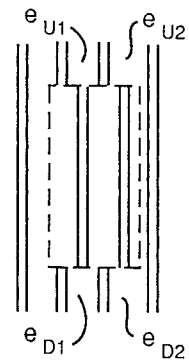
FIG._5A  FIG._5B  FIG._5C
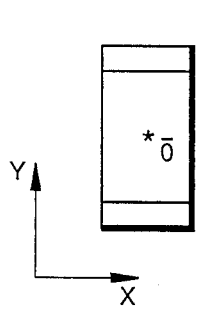
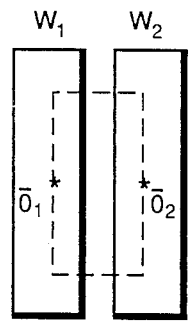
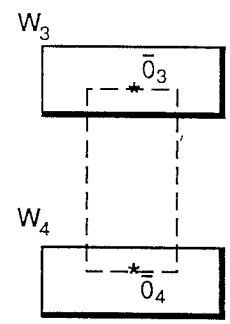
FIG._6A  FIG._6B  FIG._6C

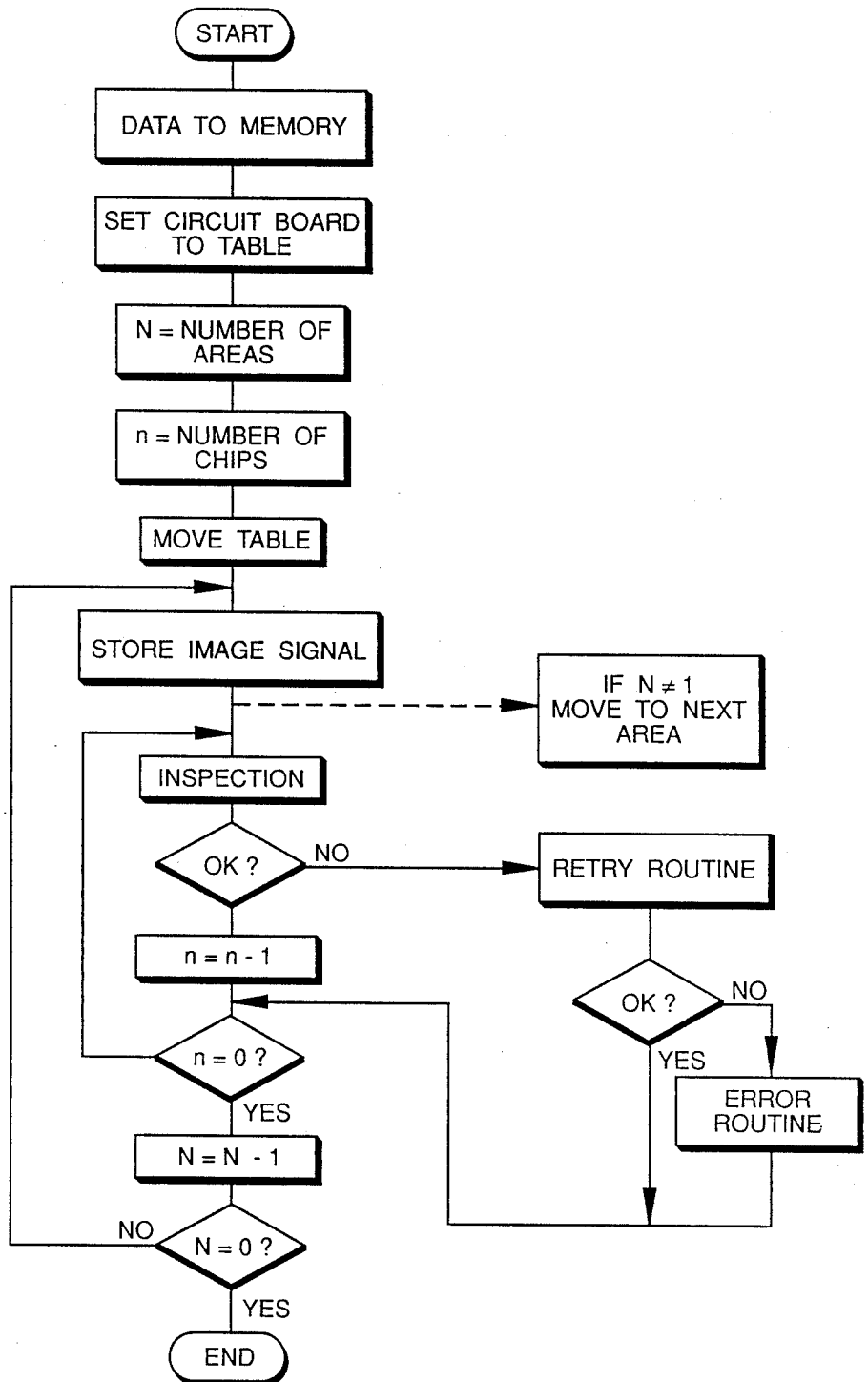
FIG._7

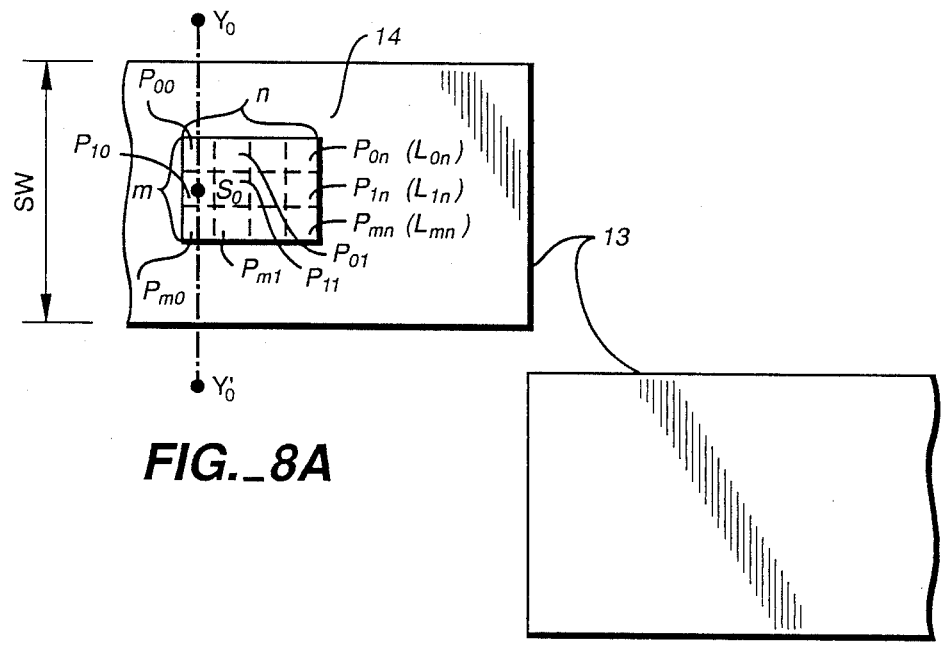
FIG._8A
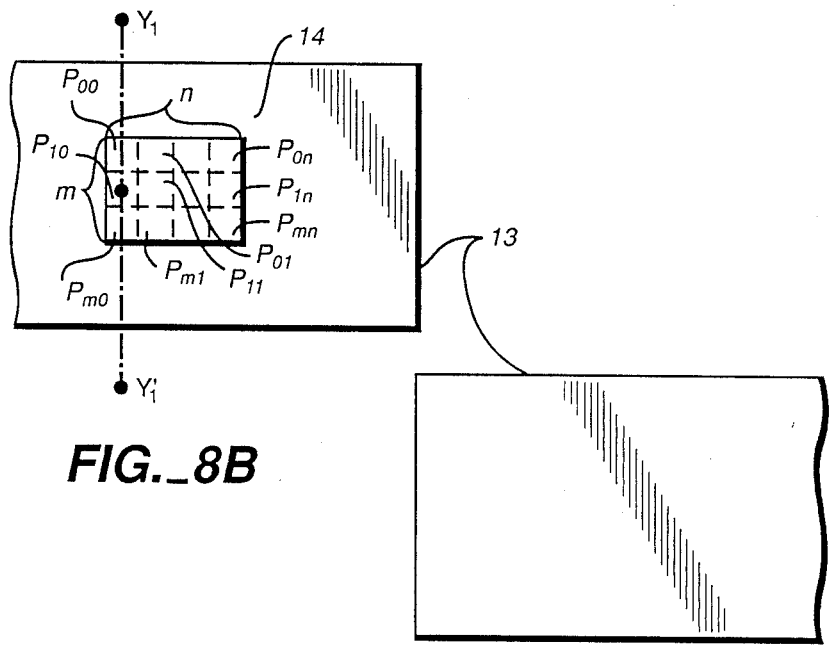
FIG._8B

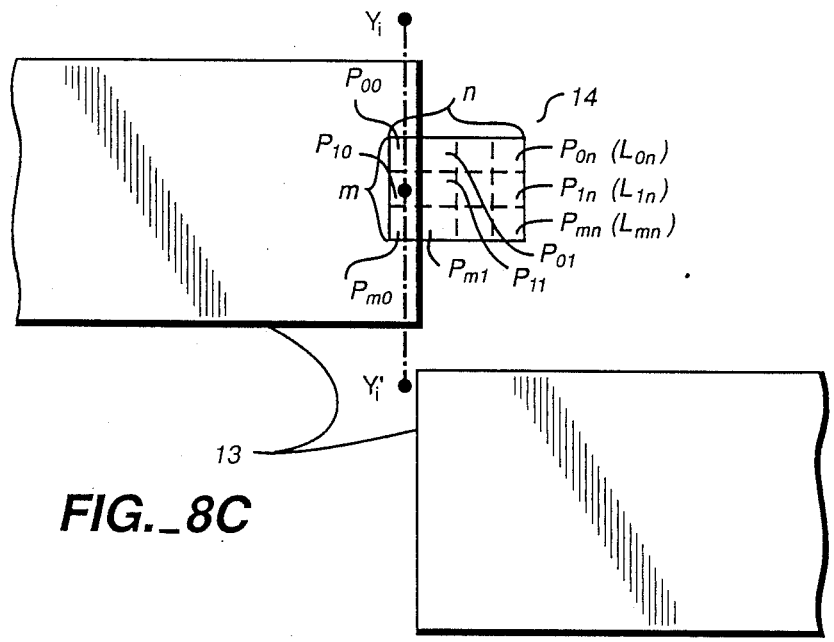
FIG._8C
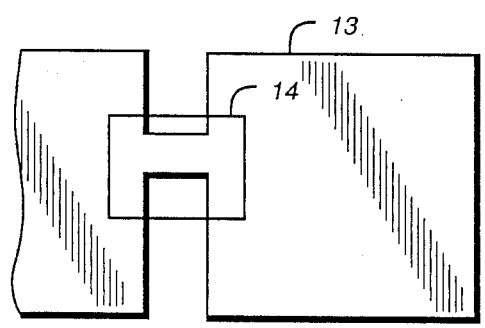
FIG._9
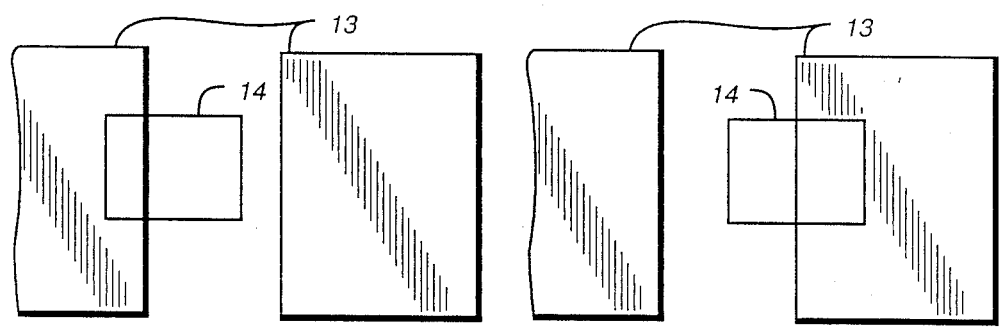
FIG._10A          FIG._10B

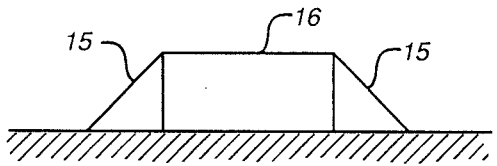
FIG._11A
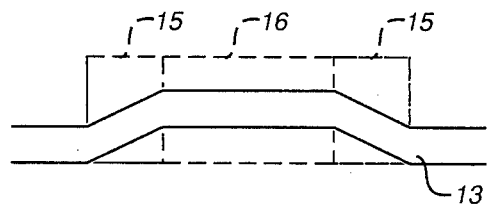
FIG._11B
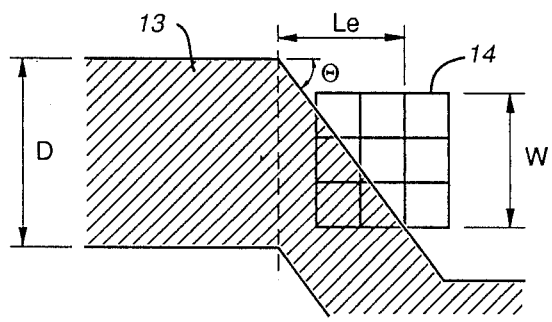
FIG._12A
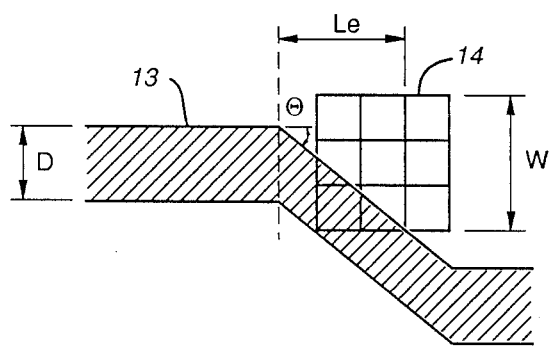
FIG._12B

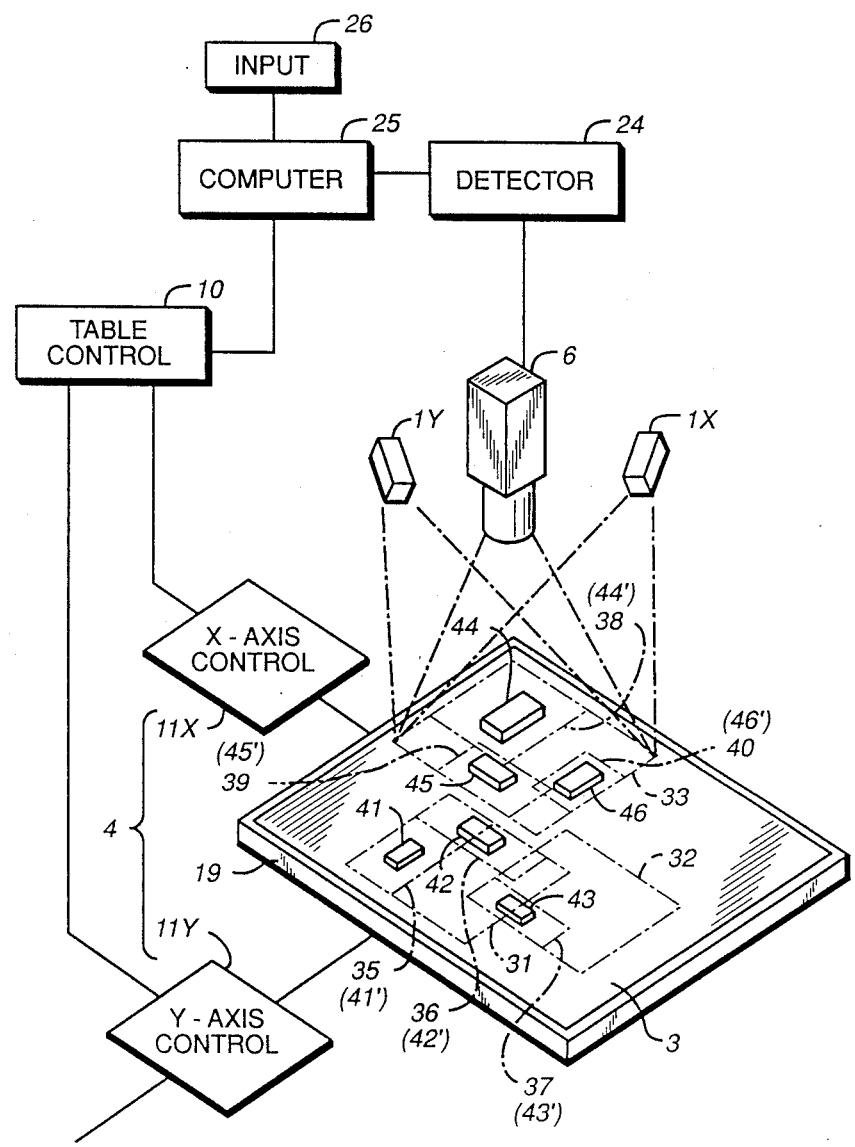
FIG._13

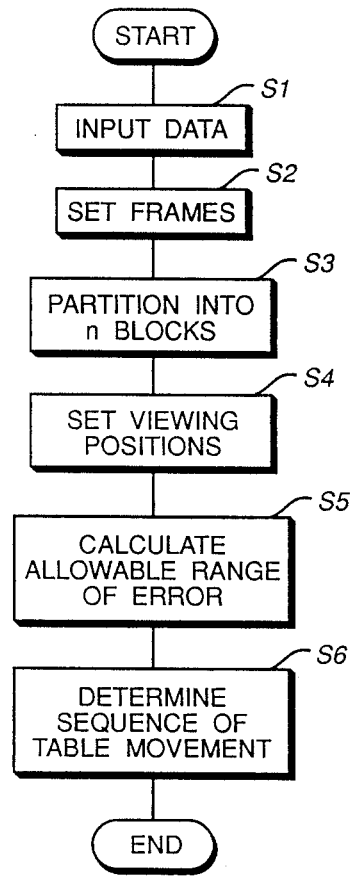
FIG._14
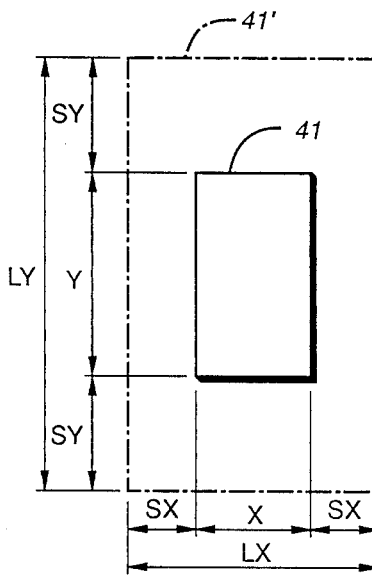
FIG._15
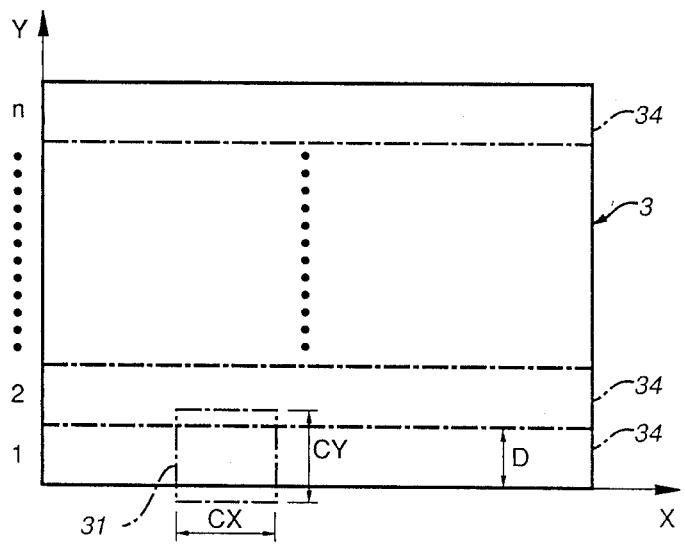
FIG._16

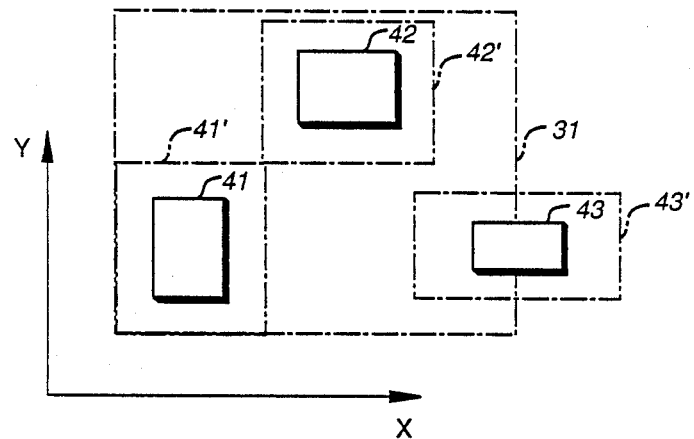
FIG._17
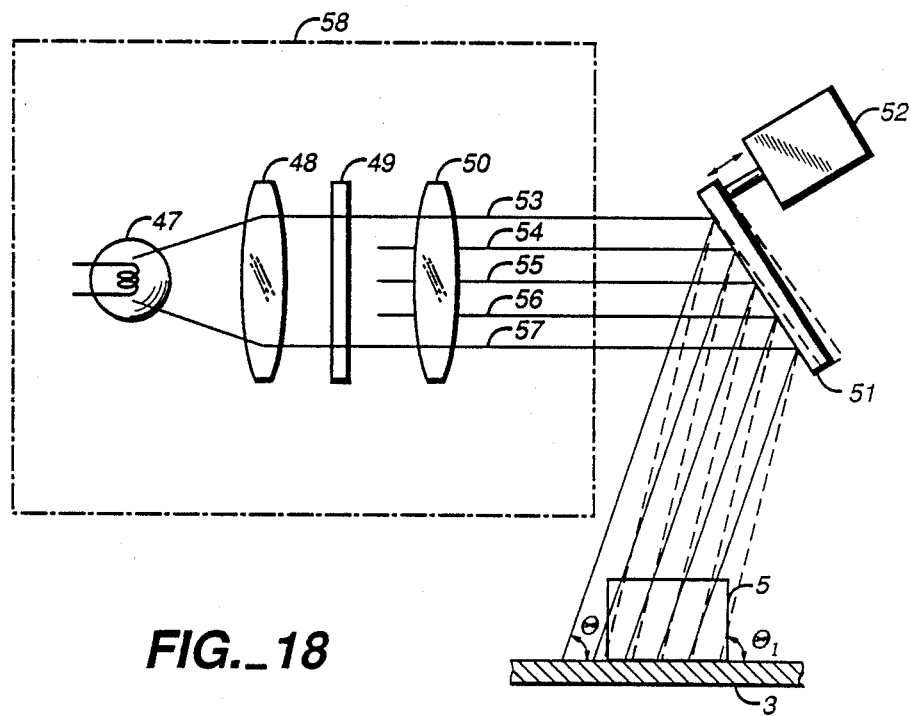
FIG._18

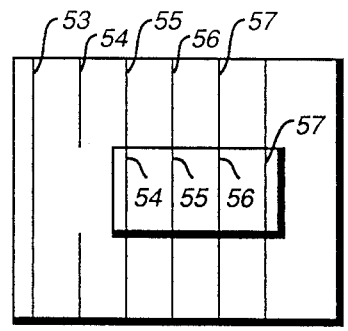
FIG._19A
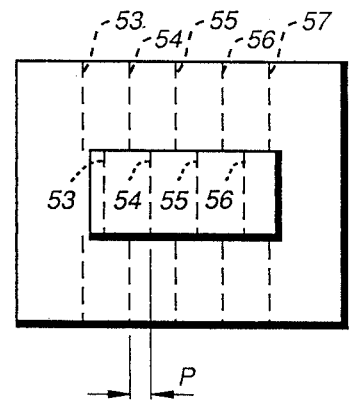
FIG._19B
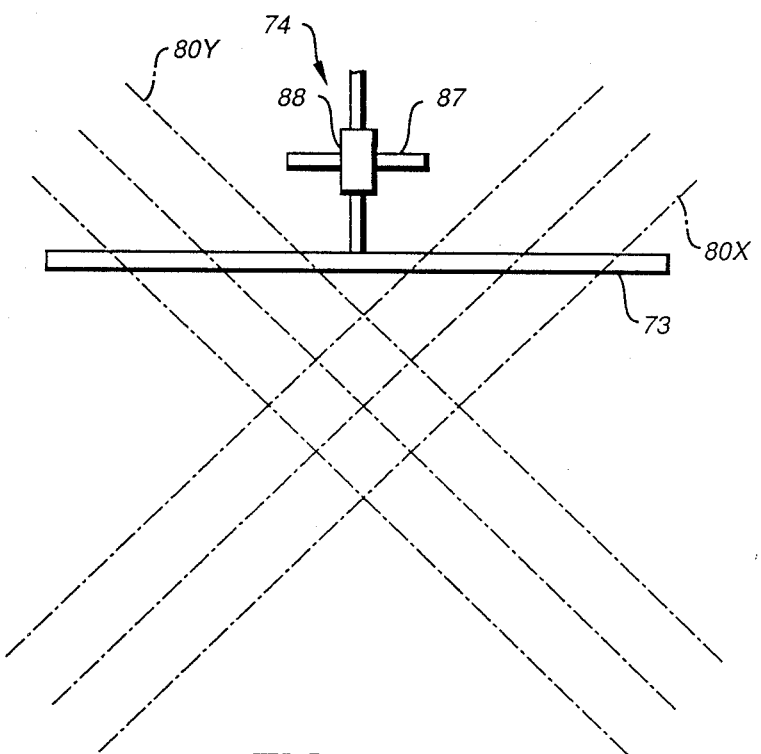
FIG._25

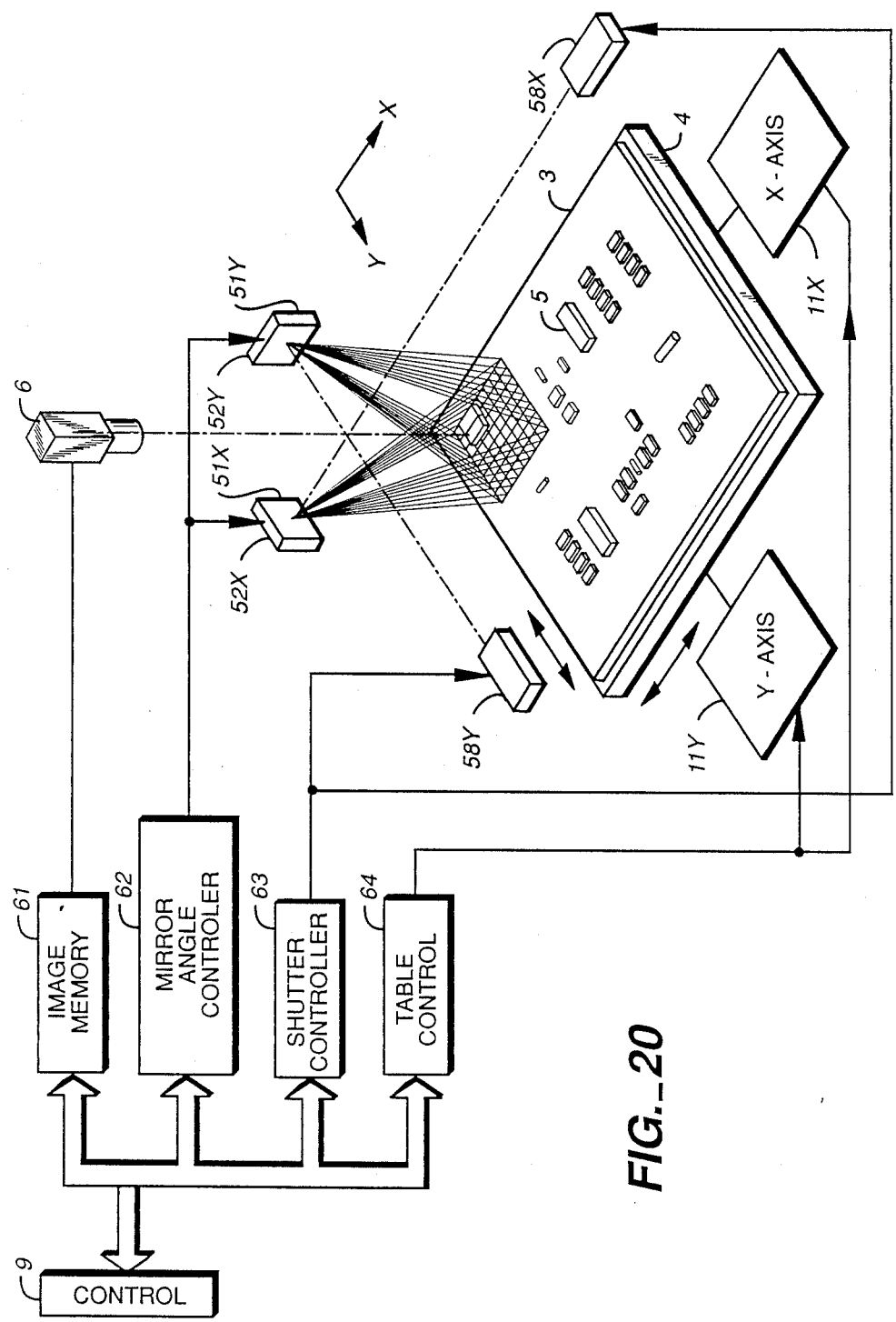
FIG._20

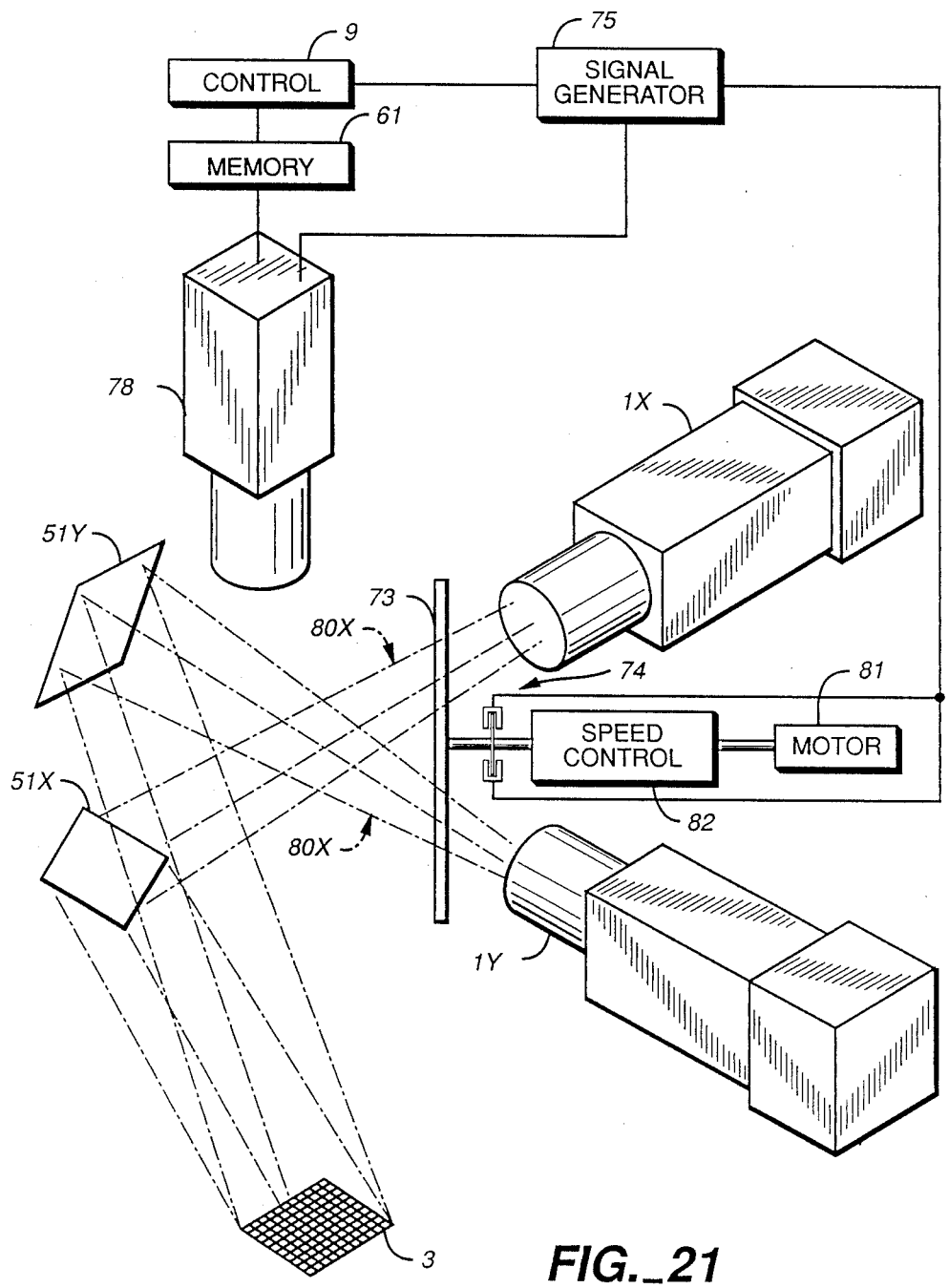
FIG._21

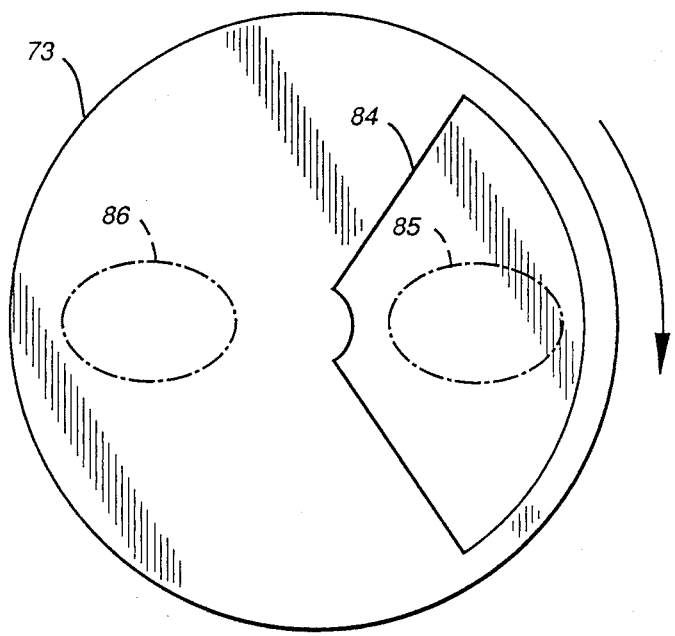
FIG._22
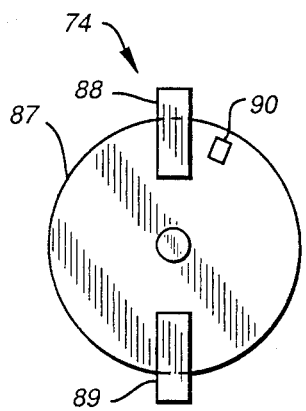   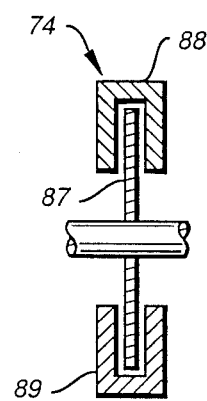
FIG._23   FIG._24

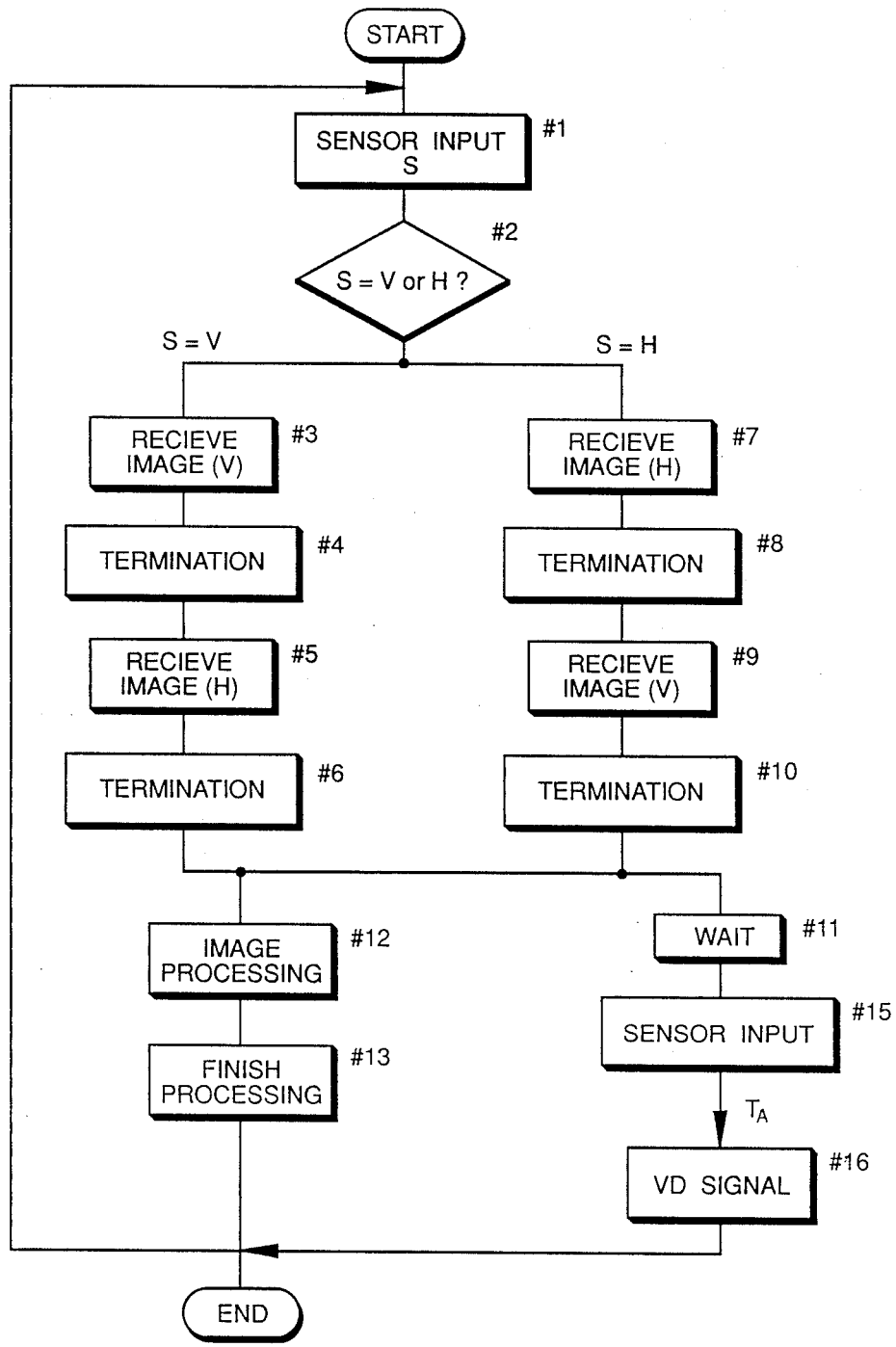
FIG._26

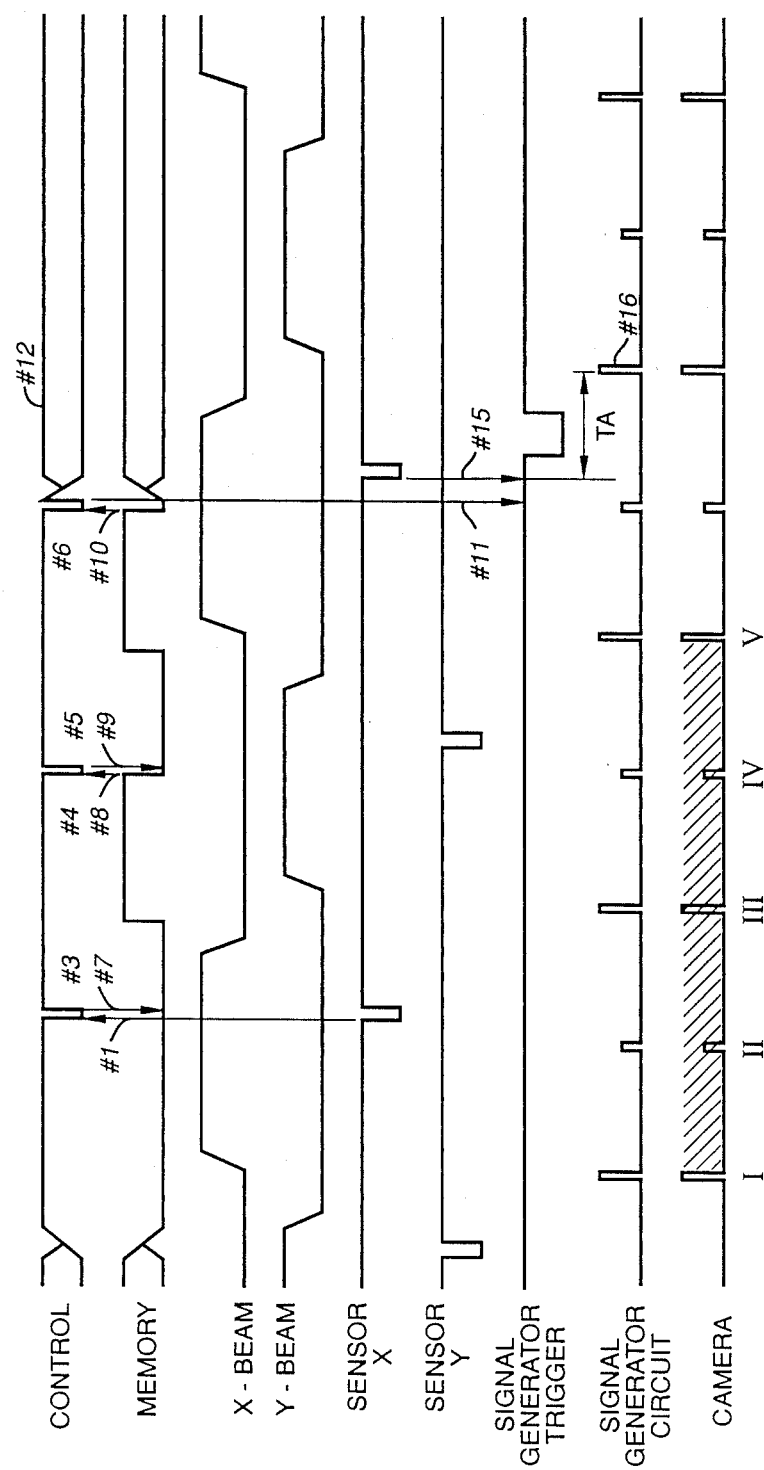
FIG._27

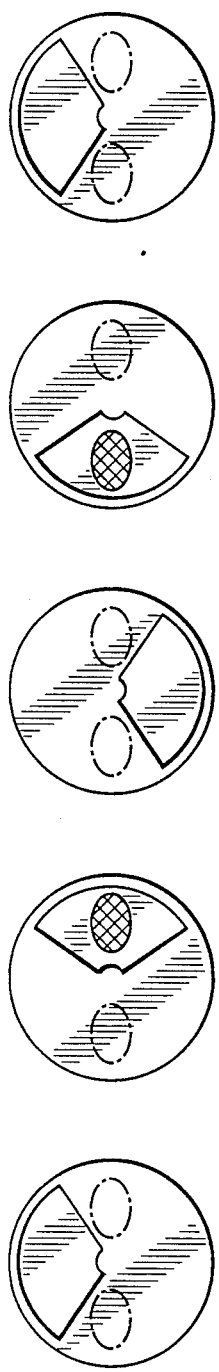
FIG._28A  FIG._28B  FIG._28C  FIG._28D  FIG._28E
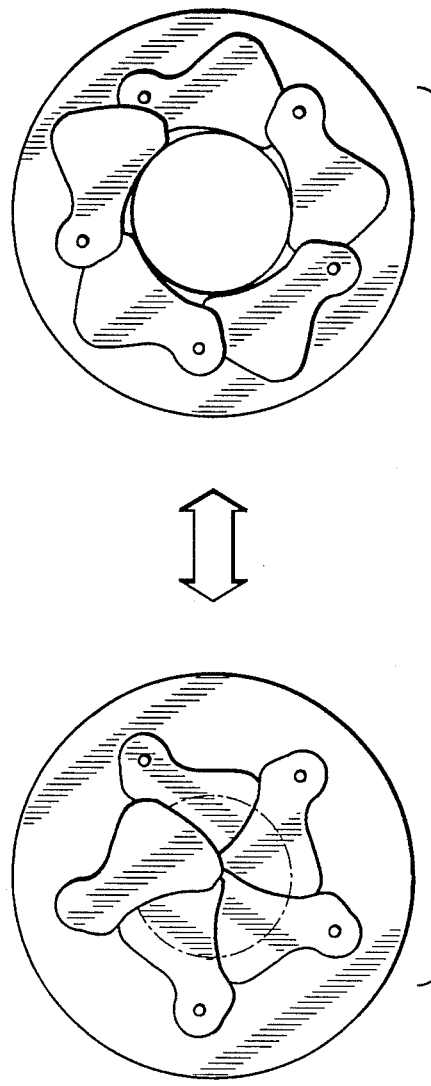
FIG._29 (PRIOR ART)

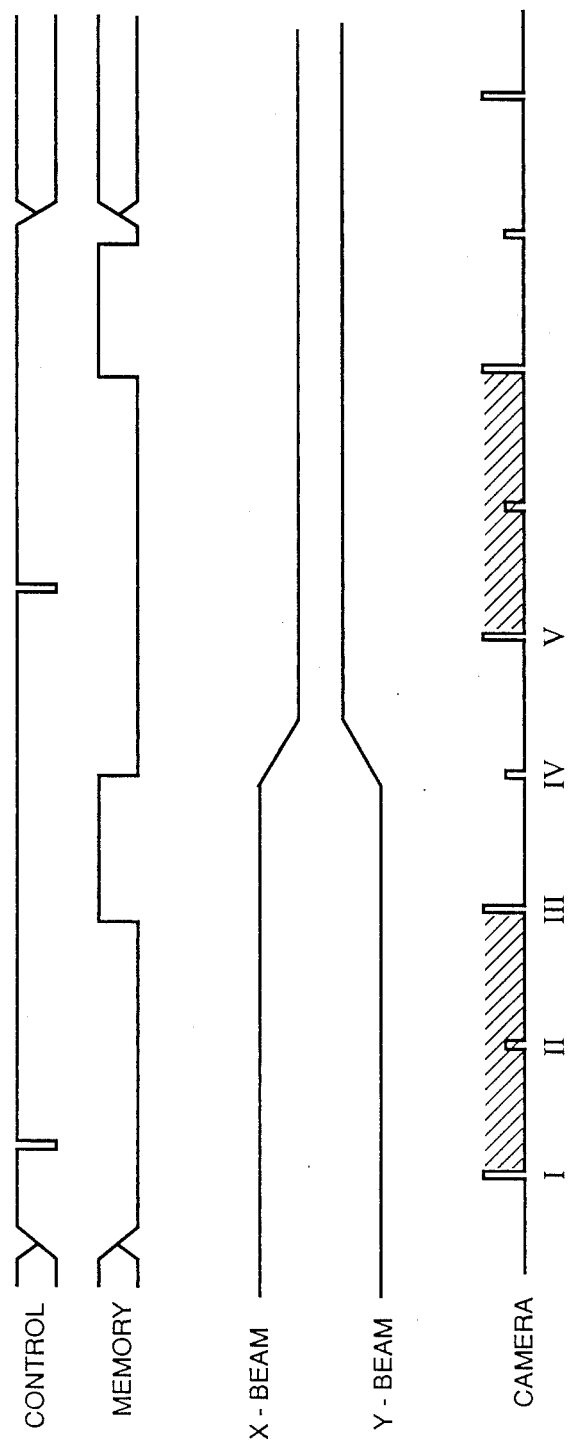
FIG._30
(PRIOR ART)

METHOD OF AND APPARATUS FOR INSPECTING MOUNTING OF CHIP COMPONENTS

BACKGROUND OF THE INVENTION

This invention relates to a method of and apparatus for automatically inspecting whether chip components mounted on a printed circuit board have been set correctly or not.

Recently, there has been a rapid progress in the technology for mounting chip components on the surface of a printed circuit board and many highly reliable high-speed, automatic mounting apparatus are currently in use. To determine whether components have actually been mounted correctly, however, it is still the visual inspection that is frequently relied upon. With the progress in surface mounting technologies for printed circuit boards, chip components are mounted at higher densities and the components themselves are becoming smaller. As a result, conventional testing methods by visual inspection are no longer sufficiently reliable or efficient. Moreover, as persons who inspect products become tired both physically and mentally, they cannot be expected to give judgments under the same criteria and there are inevitably individual differences among the inspectors.

SUMMARY OF THE INVENTION

It is therefore an object of the present invention to provide a method of and apparatus for automatically and accurately inspecting chip components mounted on printed circuit boards to determine whether they have been properly mounted or not.

It is another object of the present invention in view of the above to provide a light source unit for exposing a mounted circuit board to a plurality of mutually parallel slit line beams such that the slit line images can be prevented from overlapping one another and that edge positions of mounted components can be easily identified from discontinuities in these line images.

It is still another object of the present invention in connection with such a light source to provide a tracing method by which an end position of a discontinuous slit line image can be reliably determined.

It is still another object of the present invention to provide a shutter system with which beams from two light sources which cross each other before reaching a target area can be efficiently switched on and off alternately.

The above and other objects of the present invention can be achieved by exposing the mounted printed circuit board to be tested to a plurality of slit light beams made incident thereon diagonally from above and extracting image data from the slit line image pattern created by the chip components which protrude three-dimensionally from the otherwise flat surface of the circuit board. Positions, sizes and orientations of individual chip components mounted on the circuit board can be calculated from such image data and compared with initially inputted data based on the information how these components are expected to be mounted. Since slit light patterns fail to identify edge positions of a mounted chip component unless there are discontinuities in the projected slit lines and since the discontinuity is dependent upon the angle at which the slit line beams are made incident on the circuit board, each source of slit light beams is provided with a mirror of which the orientation can be adjusted. Thus, if no component is identified at a position where it is anticipated to be, the mirror angle is changed to increase or decrease the projection angle. In order to properly and accurately identify end positions of a slit line image, the present invention also teaches a method whereby a center point in the slit line image is selected as a starting point and brightness at points at a specified distance away is compared with a threshold brightness value. For using two separate light sources to project slit line images alternately in mutually perpendicular directions, use is made of a shutter system of a simple structure with a disk rotatably supported where the two light paths for projecting the line images in two directions cross each other. The disk has a window such that these two light paths are alternately blocked as the disk is rotated.

With an apparatus and method embodying the present invention, the edge positions of chip components mounted on a printed circuit board can be determined accurately and quickly. Since data on anticipated positions, sizes, orientations, etc. of chip components mounted on a circuit board are readily available, measured data can be easily evaluated. Since the inspection procedure can be fully automated, errors become infrequent and reliability of inspection improves significantly. Although prior art inspection apparatus were designed to inspect only one chip at a time, the present invention teaches receiving image data of many chips within a field of vision at once and hence improves efficiency of inspection. Moreover, the image receiving device can be moved from one viewing position to another while the data obtained from the first position are being analyzed. This capability adds to the improvement in efficiency. Additional advantages of the present invention include that accuracy is not adversely affected by changes in image density and that light beams can be switched on and off by a relatively inexpensive mechanism relying only on a simply rotary motion of a disk.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a block diagram of an apparatus embodying the present invention,

FIGS. 2A and 2B are examples of slit line patterns formed by slit line beams on a mounted circuit board, FIG. 3 is a plan view of a mounted circuit board partitioned into areas for inspection according to a method embodying the present invention, FIG. 4 is a plan view of one of the partitioned areas shown in FIG. 3, FIGS. 5A–5C are plan views of slit line patterns by a component mounted on a circuit board, FIGS. 6A–6C are plan views of windows used in an inspection method of the present invention, FIG. 7 is a flow chart showing an inspection method embodying the present invention, FIGS. 8A and 8B are drawings for showing a method of determining an end point of a slit line image, FIGS. 9, 10A and 10B are examples of slit line image, FIG. 11A is a side view of a component soldered onto a circuit board and FIG. 11B is a slit line pattern obtained from the soldered component shown in FIG. 11A, FIGS. 12A and 12B are examples of stored image data corresponding to a portion of the pattern shown in FIG. 11B, FIG. 13 is a block diagram of another apparatus embodying the present invention of the type shown in FIG. 1 with portions thereof shown more in detail, FIG. 14 is a flow chart showing portions of FIG. 7 more in detail, FIGS. 15, 16 and 17 are drawings for showing the concept of and a method of using frames in an inspection method embodying the present invention, FIG. 18 is a schematic drawing of a light source unit embodying the present invention, FIGS. 19A and 19B are drawings for showing slit line patterns before and after the projection angle is changed by the system shown in FIG. 18, FIG. 20 is a block diagram of another apparatus embodying the present invention of the type shown in FIGS. 1 and 13 with some portions thereof shown more in detail, FIG. 21 is a schematic drawing of a shutter system embodying the present invention, FIG. 22 is a front view of the disk shown in FIG. 21, FIG. 23 is a schematic plan view of the position sensor shown in FIG. 21, FIG. 24 is a schematic side view of the position sensor of FIGS. 21 and 23, FIG. 25 is a schematic drawing showing positional relationships of the disk and the position sensor of FIG. 21 with respect to the light paths from the light sources, FIG. 26 is a flow chart showing the operation of the shutter system of FIG. 21, FIG. 27 is a signal waveform chart for the operation by a method according to the present invention, FIGS. 28A-28E are schematic plan views for showing positional relationships between the angular orientation of the disk and the light paths, FIG. 29 is a plan view of a prior art iris-type mechanical lens shutter, and FIG. 30 is a signal wave form chart associated with a prior art shutter system.

In all these figures, components which are substantially identical or at least similar to each other are indicated for convenience by the same alphanumeric symbols.

DETAILED DESCRIPTION OF THE INVENTION

In what follows, the present invention is described by way of an example. With reference firstly to FIG. 1, a printed circuit board 3 with chip components 5 mounted thereon is placed on top of a table 4 which is freely movable two-dimensionally in X- and Y-directions as shown. For projecting lattice-like light lines on the surface of the printed circuit board 3, two sources of slit light beams 1X and 2Y respectively for the direction of the X-axis and the Y-axis are placed diagonally above the table 4. Each of these light sources 1X and 1Y is provided with a shutter 2X or 2Y such that line beams in the X- and Y-directions can be selectably and separately made incident on the mounted chip components 5 by controlling these shutters 2X and 2Y. An image receiving device 6 such as a camera is disposed above the printed circuit board 3 for receiving an image of the target objects as well as of their surroundings. An analog-to-digital (A/D) converter 7, an image processing device 8 to be described below more in detail and a control circuit 9 are serially connected to this image receiving device 6. The control circuit 9 is also connected to a table driving circuit 10 for moving the table 4 so as to control its motion through an X-direction driver 11X and a Y-direction driver 11Y.

More in detail, the X- and Y-direction drivers 11X and 11Y are operated by a signal transmitted from the control circuit 9 to the table driving circuit 10 such that those of the mounted chip components 5 on the printed circuit board 3 to be inspected come within the viewing range of the image receiving device 6. First, the shutter 2X on the X-direction light line source 1X is operated to project lines of light in the X-direction on these target components 5 and the slit pattern image obtained thereby is viewed from above by the image receiving device 6. Next, the shutter 2Y on the Y-direction light line source 1Y is operated to project lines of light in the Y-direction and the slit pattern image thus obtained is similarly viewed by the image receiving device 6. Image data corresponding to these pattern images are converted into a digital signal by the analog-to-digital converter 7.

Since the chip components 5 on the printed circuit board 3 are three-dimensional objects, the image of the light lines change according to their three-dimensional shapes. Near the outer peripheries of a viewing range, in particular, the image of the light lines become discontinuous, making it possible to detect the shape of these chip components 5. Thus, the digitally converted data are transmitted to the image processing device 8 where detection, calculation and judging circuits cooperate to detect the edges of the slit lines, calculate characteristic values of various kinds and eventually evaluate on the basis of such values whether the chip components 5 under investigation are properly mounted. The same procedure is repeated after the table 4 is moved and the conditions of all chip components 5 on the printed circuit board 3 can be inspected in this manner.

FIGS. 2A and 2B show examples of slit patterns projected on a chip component. Since the slit lines in the X-direction (FIG. 2A) and the Y-direction (FIG. 2B) are separately projected, each slit line can be inspected without interference from lines in the transverse direction and the edges (indicated by (1)-(6)) of the component 5 can be accurately determined. Although use of shutters was disclosed above for projecting slit lines in the X- and Y-directions, this is not intended to limit the scope of the present invention. Instead, strobes and switches may be used to emit light beams at desired time intervals to obtain desired slit images. Moreover, the slit light lines may be bright or dark lines.

Next, a method of inspection by using the apparatus described above is explained by way of the flow chart shown in FIG. 7. Initially, data related to individual chip components such as their positions, external dimensions, orientations and kinds are stored in the memory device of the image processing device 8. These data are stored in the order in which they are to be inspected and may be either created automatically or registered manually. In the "automatic creation mode", the data available from the time when the printed circuit board was designed or the data on a device carrying the chip components of interest transmitted to the inspection apparatus through telecommunication lines or by means of a floppy disk and the circuit board to be inspected is divided into areas to be viewed on the basis of these transmitted data. In the case of a circuit board 3 shown in FIG. 3, for example, four areas 3-1, 3-2, 3-3 and 3-4 each surrounded by broken lines may be sequentially viewed for the inspection of chips therein. Thereafter, the order in which the chips in each of the areas are to be inspected is determined. The three chips in Area 3-1 of FIG. 3 may be inspected in the order of 4-1, 4-2 and 4-3 as shown in FIG. 4. Data are stored in the memory in this order. In the "manual registration mode", use is made of an input device such as a mouse or a keyboard to effect the same procedure.

After these data have been stored, the printed circuit board 3 to be inspected is set on the table 4 and the inspection is started. The apparatus makes references to data and causes the table 4 to move such that the area to be viewed comes directly under the camera 6. When the target area comes directly under the camera 6, the shutters 2X and 2Y of the light sources 1X and 1Y are controlled such that slit lines are projected separately in the X- and Y-directions. Each time, image data received by the camera 6 are transmitted through the analog-to-digital converter 7 to the image processing device 8 and stored in the image memory device. As soon as these data are received, the table 4 starts moving to the next position while the received data are analyzed as will be explained below to determine whether the chips in the viewed area are properly mounted. This serves to improve the overall speed of inspection.

In the case of a chip component shaped as shown in FIG. 5A, for example, its slit images inputted by light lines in the X- and Y-directions may be as shown in FIGS. 5B and 5C, respectively, where $e_{L1}$-$e_{L3}$ are the X-coordinates of the left-hand ends of slit light beams in the X-direction, $e_{R1}$-$e_{R3}$ are those of their right-hand ends, $e_{U1}$-$e_{U3}$ are the Y-coordinates of the upper ends of the slit light beams in the Y-direction and $e_{D1}$-$e_{D3}$ are those of their lower ends, respectively. From such input images, "windows" are set for each chip to be inspected on the basis of the stored data thereon, the size of the windows being determined by the detected positional displacement and the external dimensions of the chip component. In the case of a standard chip component with no positional displacement, windows are generated as shown in FIGS. 6A-6C. If the coordinates of the center point of the standard chip component are (a,b), its external dimensions are (X,Y), the standard deviations thereof are ($\Delta X, \Delta Y$) and the detected positional displacements are ($m_x, x_y$), the coordinates of the center of Window $W_1$ shown in FIG. 6B are $\overline{O}_1(a-X/2, b)$, its length in the X-direction is $2(\Delta X+m_x)$ and its length in the Y-direction is $2(\Delta Y+m_y)+Y$; the coordinates of the center of Window $W_2$ shown in FIG. 6B are $\overline{O}_2(a+X/2, b)$, its length in the X-direction is $2(\Delta X+m_x)$ and its length in the Y-direction is $2(\Delta Y+m_y)+Y$; the coordinates of the center point of Window $W_3$ shown in FIG. 6C are $\overline{O}_3(a,b-Y/2)$, its length in the X-direction is $2(\Delta X+m_x)+X$ and its length in the Y-direction is $2(\Delta Y+m_y)$; and the coordinates of the center point of Window $W_4$ shown in FIG. 6C are $\overline{O}_4(a,b+Y/2)$, its length in the X-direction is $2(\Delta X+m_x)+X$ and its length in the Y-direction is $2(Y+m_y)$.

After the windows are thus set, inspection is carried out according to the following algorithm. Firstly, threshold values are set for distinguishing between slit light beams and the background. They are set for each chip and separately for the X- and Y-directions. Next, these threshold values are used to detect slit lines and to determine the coordinates of their end points. If the end points are not within the corresponding windows, it is concluded that this chip component is not properly mounted and hence that the circuit board is defective. Only those of the detected slit light beams which serve to show the size of a chip component are kept and the rest are excluded. This is done by examining whether the condition $(X-\Delta X) \leq (e_R-e_L) \leq (X+\Delta X)$ or $(Y-\Delta Y) \leq (e_U-e_D) \leq (Y+\Delta Y)$ is satisfied regarding the length of a slit beam on a chip and whether the conditions $e_{LX} \leq e_X \leq e_{RX}$ and $e_{DX} \leq e_Y \leq e_{UX}$ are satisfied where $e_L=(e_{LX}, e_Y)$, $e_R=(e_{RX}, e_Y)$, $e_U=(e_X, e_{UY})$ and $e_D=(e_X, e_{DY})$ are two-dimensional coordinates of the left-hand, upper and lower end points of slit light beams which cross each other. If there are not slit light beams satisfying these conditions, the chip component is considered defective.

If the slit light beam pattern for a chip component is as shown in FIGS. 5B and 5C, the coordinates of its center is obtained by the formulas $C_X=(\overline{e}_{LX}+\overline{e}_{RX})/2$ and $C_Y=(\overline{e}_{UY}+\overline{e}_{DY})/2$ where the symbols on the right-hand sides of the equations indicate averages over the slit lines. The values of $C_X$ and $C_Y$ thus calculated are compared with the corresponding data initially stored in the memory device and if either of the differences is greater than the corresponding threshold value, the chip is considered unacceptably displaced.

As shown in the flow chart of FIG. 7, retry routines are provided for chips which cannot be judged by the procedure explained above. Examples of retry routines to be provided include one for the case of a chip with halation and one for the case of a slit line which is totally broken up due to peculiar surface conditions of the chip. If retry routines are carried out for particular chip areas after the regular routine is completed, the algorithm can be simplified and the inspection can be carried out more efficiently. It also goes without saying that many variations of the above are to be considered within the scope of the present invention. For example defects and displacements may be detected by comparing the size of the standard chip (X,Y) and the lengths of the light beams ($e_R-e_L$, $e_U-e_D$). The apparatus of FIG. 1 may be modified such that the table 4 remains stationary and the camera 6 is moved. The inspection device described above need not be independently provided but may be incorporated in a device carrying electronic components.

Next, a method of tracing the center of a slit line beam is explained by way of an example and with reference initially to FIGS. 8A-8C which show a situation where an image received by the camera 6 of FIG. 1 has been converted into 256 digital data by the analog-to-digital converter 7 and these converted data have been stored in a RAM within the image processing device 8. In FIG. 8A, $y_0$—$y_0$, indicates a starting line for inspection of a slit image 13. This is scanned and an initial threshold value $Th_0$ is determined by a known method such as the so-called "P-tile" method. This threshold value is used to detect the width $S_w$ of this slit image 13 and its center $S_0$ also is determined. In the meantime, it is constantly being ascertained that the line $y_0$—$y_0'$ does across the slip image 13 under inspection. Next, this center point $S_0$ is used as the starting point and an inspection window 14 with the size of $m \times n$ pixels is set as shown (m=3 and n=4 in FIGS. 8A-8C for convenience). These pixels correspond to memory elements of the RAM.

Next, brightness (or luminosity) values $L_{0n}$-$L_{mn}$ of the pixels $P_{0n}$-$P_{mn}$ on the right-hand edge of this window are examined and, if any of them exceeds the threshold value $Th_0$, it is determined that there is a slit and a line $y_1-y_1$, is set over the pixels $P_{0n}-P_{mn}$ (of FIG. 8A). The routine explained above is repeated next with reference to this newly set line $y_1-y_1'$ as shown in FIG. 8B. At the same time, a new threshold value $Th_1$ is selected. As this routine is further repeated, the window thus set eventually reaches the right-hand end point of the slit line. FIG. 8C shows this situation wherein the luminosity values $L_{0n}-L_{mn}$ along the right-hand edge of the window 14 are all below the threshold value $Th_i$ at this moment, i indicating the number of repetitions which have brought the window 14 to this position from the initial position shown in FIG. 8A. These low luminosity values now indicate that the right-hand end point of the slit line is inside this window 14 (of FIG. 8C) and a search for the exact location of the end point is continued from the left-hand edge along the pixels $P_{00}-P_{0n}$ one column at a time. When a column (the jth) is reached such that the luminosity values of all pixels $P_{0j}-P_{mj}$ on this column are below the threshold value $Th_i$, it is considered the true right-hand end point.

With the tracing method of the present invention explained above, end points of slit lines can be efficiently and accurately determined even if there are large variations in the luminosity of the image. Even if the widths of a slit line changes as shown in FIG. 9, such changes do not affect the accuracy of the method. In the case of a small gap in a slit line as shown in FIGS. 10A and 10B, the end points can be still correctly identified if the inspection routine is slightly modified such that the window is advanced one step further after an end point of a slit line is tentatively detected as shown in FIG. 10A. If the slit is detected again at this advanced position shown in FIG. 10B, it is considered that the gap detected in the position of FIG. 10A does not really represent the end point and the window is further advanced to the right-hand side as explained above. If no slit image s detected at the advanced window position (unlike FIG. 10B), the end point detected (in FIG. 10A) before the window was advanced is considered the true end point.

Another advantage of the tracing method of the present invention is appreciated with reference to FIGS. 11A and 11B. When a chip component 16 is soldered as shown in FIG. 11A wherein numeral 15 indicates solder, the slit light line thereon may become diagonal as shown in FIG. 11B because of sloped solder surfaces. The width of a slit line may further fail to remain constant. By the method of the present invention, however, the same end point can be accurately identified. If the slit width is D and the window width is W and if the slit bends by $\theta$ as shown in FIG. 12A or 12B, say, due to a sloped solder surface as shown in FIG. 10A, the detection error $L_e$ is $(D+W)/(2\tan\theta)$ in both cases.

In the case of slits with large fluctuations in brightness, the value of n for the windows should be reduced. If the fluctuations are small, n may be made large to reduce the time required for determining end points.

In connection with the method and apparatus of the present invention, for example, as shown and described above by way of FIG. 1, a method of preparing the data to be initially stored in the image processing device 8 is described next in detail.

As shown in FIG. 13 which describes portions of FIG. 1 more in detail, a printed circuit board 3 with chip components 41–46 such as semiconductor elements, capacitors and resistors mounted thereon is secured to a base plate 19 of a table (or a so-called XY table) 4 which is comprised not only of the base plate 19 but also of an X-direction and Y-direction control means 11X and 11Y so as to be able to move the printed circuit board 3 two-dimensionally along a mutually perpendicular set of axes X and Y. Above the printed circuit board 3 are an image receiving device 6 and light sources 1X and 1Y. The image receiving device 6 is connected to detecting means 24 for detecting mounted positions of components based on data signals outputted from the image receiving device 6.

The detecting means 24 is also connected to input means 26 through a computer 25. The input means 26 may comprise a keyboard, a floppy disk driving device, ports for data communication, etc. such that a series of data inclusive of the sizes, positions, orientations, etc. of the mounted chip components 41–46, their maximum allowed displacements, etc. may be inputted therethrough. The computer 25 is designed to serve as a combination of means for determining viewing positions for the image receiving device 6 such that those of the chip components to be inspected can be viewed, means for determining for each viewing position of the image receiving device 22 allowable ranges of positions for viewable chip components, means for comparing the positions of the chip components 41–46 detected by the detecting means 24 with the allowable ranges of their positions and means for determining a sequence according to which the image receiving device 6 is to be moved from one to another of the viewing positions. The computer 25 is also connected to a table control means 10 for controlling the table 4.

Before the mounted conditions of the chip components 41–46 are inspected by the apparatus thus structured, various data as explained above by way of FIG. 7 are inputted through the input means 26 as shown also in FIG. 14 (at S1) which is another flow chart showing portions of FIG. 7 more in detail. Next, frames 41'–46' are defined to serve as boundaries of allowable ranges of positions of the individual chip components 41–46 (S2). A method of defining a frame according to the present invention for this purpose is explained next by way of FIG. 15 wherein the component 41 is illustrated as having a size indicated by X and Y. If the maximum allowable positioning error regarding this component 41 is SX and SY respectively in the X- and Y-directions, the size of its frame 41' is given by $LX=X+2SX$ and $LY=Y+2SY$.

After frames 41'–46' are thus calculated respectively for the chip components 41–46, the surface of the circuit board 3 is partitioned in the direction of the Y axis as shown in FIG. 16 into n blocks 34 of width D each (S3). If the area 31 on the circuit board 3 viewable from a single viewing position by the image receiving device 6 is $CX \times CY$, D is selected to be smaller than CY. Next, viewing areas 31–33 on the circuit board 3 are set for each of the blocks 34 (S4). In the case of the chip components 41–43 contained in the first of the blocks 34 and having frames 41'–43' as shown in FIG. 17, for example, a first viewing area 31 is so selected that the frame or frames with the smallest X-coordinate and the smallest Y-coordinate (the frame 41' as both in this example) will be at the left-hand edge and the bottom, respectively. After such a viewing area is determined, the chip components of which the frames are completely contained therein are assigned numbers ascendingly to represent their viewing sequence. In FIG. 17, two (41 and 42) of the chip components 41–43 have their frames completely within this viewing area 31 and are therefore numbered "1" and "2", respectively. For the third chip component 43, another viewing area 32 is set similarly with respect to its frame 43' as shown in FIG. 13 and is numbered "3". After the viewing sequence of all components within a block is completed, the same routine is repeated for the next one of the blocks 34.

After the viewing areas 31–33 are thus determined, maximum allowable ranges of positions 35–40 respectively for the chip components 41–46 are determined (S5) for each of the vieWing areas 31–33 on the basis of the mounted positions of the chip components 41–46 on the circuit board 3, their frames 41'–46' and the viewing areas 31–33. Additionally, the distances by which the table 4 must be moved such that each of the viewing areas 31–33 can be viewed by the image receiving device 6 are also calculated. The sequence of tab)e motions is determined at this moment such that the frequency of movements by the table 4 and the distance to be traveled are minimized (S6).

Thereafter, the table 4 is moved according to the results of calculations obtained in Step S6. At each table position, image data from the corresponding one of the viewing areas 31–33 are received by the image receiving device 6. Image data of all chip components 41–46 are thus received and stored in a memory device of the computer 25. The positions of the individual chip components 41–46 are detected on the basis of these data and a final determination whether the printed circuit board 3 is defective or not is made as explained above by way of FIG. 7. Although a single computer was disclosed at 25 in FIG. 13 for both preparing data and for carrying out inspections but this is not intended to limit the scope of the present invention. A plurality of computers may be employed for their separate functions.

Next, the slit light sources 1X and 1Y of FIG. 1 and FIG. 13 are described more in detail. As shown in FIG. 18, light energy emitted from a source 47 such as a halogen lamp is passed through a condenser lens 48 or the like to form a parallel beam in order to improve the illumination efficiency and made incident uniformly onto a slit screen 49. Although not illustrated in the figure, this slit screen 49 comprises a glass plate with vapor-deposited chromium thereon and there are 63 slits of 15 µm in width formed thereon at a pitch of 400 µm. Thus, the parallel beam of light from the condenser lens 48 appears, after passing through this slit screen 49, as slit light beams. (Only five of these slit light beams 53–57 are shown in FIG. 18 for convenience.) The slit light beams 53–57 thus generated are thereafter passed through a focusing lens 50 and reflected by a mirror 51 subsequentially to be projected onto a selected area of the printed circuit board 3. In FIG. 18, numeral 58 indicates a box for this optical unit containing the source lamp 47, the lenses 48 and 50 and the slit screen 49.

More in detail, the slit light beams 53–57 passing through the focusing lens 50 are reflected by the mirror 51 connected to an angle control device 52 for adjusting the angle of incidence of these beams 53–57. The angle $\theta$ made between these beams 53–57 and the surface of the printed circuit board 3 will be hereinafter referred to as the projection angle. The aforementioned angle control device 52 is essentially a servo mechanism comprised of an actuator or the like for varying the angle of the mirror 51. A retractable arm is attached to an edge on the backside of the mirror 51 such that the projection angle $\theta$ can be adjustably varied. In FIG. 18, dotted lines indicate how the projection angle $\theta$ may be changed by changing the angle of the mirror 51.

FIGS. 19A and 19B show how detectability of a three-dimensional chip components 5 mounted on the circuit board 3 can be affected by the projection angle $\theta$. FIG. 19A shows a situation where the slit light images projected on the circuit board 3 and the mounted component 5 are apparently continuous and hence the component 5 cannot be detected. If the projection angle is changed from $\theta$, say to $\theta_1$ as shown in FIG. 18, the slit line images can be relatively displaced as shown in FIG. 19B such that the chip components 5 on the circuit board 3 can be made detectable.

Functional relationship between the slit light source shown in FIG. 18 and an apparatus of the type shown schematically in FIGS. 1 and 13 is shown in FIG. 20 wherein the optical unit boxes for the light sources 1X and 1Y are separately shown at 58X and 58Y as well as their associated mirrors 51X and 51Y and their angle control devices 52X and 52Y. Various controlling means such as mirror angle control means 62 and shutter control means 63 in addition to the table controller 10 are separately illustrated for the purpose of explanation.

Commands for moving the table 4 are transmitted through the table controller 10 to the X- and Y-direction table drivers 11X and 11Y such that the first viewing area on the circuit board 3 can be viewed through the image receiving device 6. Next, the lamps in both optical unit boxes 58X and 58Y are switched on and a command is transmitted to the shutter controller 63 such that shutters for light sources in the two boxes 58X and 58Y are alternately operated. As a result, slit line images in the X- and Y-directions are alternately projected on the circuit board 3 and these images are received by the image receiving device 6 and sequentially stored in the memory device for he control device 9 (shown separately at 61 in FIG. 20). If slit line images either in the X-direction or the Y-direction overlap as shown in FIG. 19A such that one of the components 5 on the circuit board 3 cannot be detected, a command is transmitted through the mirror angle controller 62 to cause the corresponding angle control device 52X or 52Y to change the angle of the associated mirror 51X of 51Y to thereby change the projection angle $\theta$ as explained above such that the overlapping of slit line images is removed and the hitherto undetectable component 5 becomes detectable. In other words, since commands for operating the angle control devices 52X and 52Y which form servo mechanisms correspond to the projection angles (both in the X- and Y-directions), the control unit 9 has a record of these projection angles and hence is capable of examining chip components 5 on the basis of these projection angles and the corresponding distance of separation P shown in FIG. 19B.

Mechanisms embodying the present invention for the aforementioned shutters are explained next by way primarily of FIG. 21. As mentioned above, shutters are used in the apparatus embodying the present invention for quickly switching the projection of light beams in the X- and Y-directions. Prior art technologies for this purpose included devices using iris-type mechanical lens shutters as shown in FIG. 29, liquid crystal elements, ceramic elements or strobe light sources. Iris-type mechanical lens shutters are disadvantageous because they include many parts which operate in complicated manners and hence cannot operate quickly and do not last long. As for high-speed shutters relying on a liquid crystal or a ceramic element, the amount of transmitted light varies significantly, depending on changes in temperature. They are therefore not easy to use near a heat-emitter such as a light source. Devices using a xenon light-emitter of the type satisfactory regarding both brightness and lifetime are too expensive to be practical.

With reference to FIG. 21 which shows a shutter system according to the present invention, numeral 73 indicates a disk to be described more fully below, numeral 74 indicates a rotary position sensor, numeral 75 indicates a signal generation circuit, numeral 81 indicates a motor for rotating the disk 73 and numeral 82 indicates a mechanism for controlling the rotary motion of the disk 73. As explained above in connection with FIGS. 1, 13 and 20, the light sources 1X and 1Y are so adapted as to transmit slit light beams which cross each other perpendicularly to each other somewhere on a plane parallel to the target surface (represented in FIG. 21 by that of the printed circuit board 3) and closer to the image receiving device 6 before projecting slit line images respectively in the X- and Y-directions on that target surface. The disk 73 is rotatably supported at a position where it blocks by crossing both light paths 80X and 80Y respectively from the light sources 1X and 1Y to the target surface. The rotary position sensor 74 may be of any known kind and is adapted to detect the angular position of the disk 73.

The signal generation circuit 75 is adapted to output vertical and horizontal external synchronization signals to the image receiving device 6 according to the rotary orientation of the disk 73 as detected by the sensor 74. The control unit 9 performs various operations, as explained above, upon receiving image data through the image receiving device 6. When a signal from this control unit 9 has been received, the signal generation circuit 75 waits for a predetermined length of time $T_A$ after a signal from the position sensor 74 is received and transmits a vertical synchronization signal. The image receiving device is adapted not only to receive image data from the target surface, but also to retain the image data for a predetermined time interval. Alternatively, the operation of the image receiving device 6 may be externally controlled, for example, by vertical synchronizing video signals (vertical drive VD).

The rotatably supported disk 73 is provided with a shutter window 84 shaped as shown in FIG. 22 like a fan with rims which are coaxial to the circular periphery of the disk 73 itself. Areas 85 and 86 surrounded by dotted elliptical lines in FIG. 22 schematically indicate cross sections of slit light beams 80X and 80Y respectively from the light sources 1X and 1Y as they cross the disk 73. As the disk 73 is rotated around its axis of symmetry, the light paths 80X and 80Y are therefore alternately blocked. The disk 73 is rotated at a rate of about 900rpm. Of the video signal from the image receiving device 6, the vertical synchronizing signal has a frequency of about 33.4 milliseconds per field. Thus, the disk 73 makes about 0.5 rotations at this frequency.

The rotary position sensor 74 may be structured as shown in FIGS. 23 and 24 with a detector disk 87 disposed coaxially and affixed so as to rotate with the disk 73 of which the orientation is to be detected. An opening 90 is formed at a point near the outer periphery of this detector disk 87 and two photoswitches 88 and 89 are disposed near its periphery and diametrically opposite to each other. As the detector disk 87 rotates, the opening 90 also rotates and a signal is outputted whenever this opening 90 passes the position of either one of these photoswitches 88 and 89.

The positional relationships of the disk 73 and the position sensor 74 with respect to the light paths 80X and 80Y which cross each other perpendicularly to each other are shown in FIG. 25. As explained above in connection with FIG. 21, the disk 73 is so positioned as to cross both of these light paths 80X and 80Y. Thus, as the disk 73 rotates and its shutter window 84 comes to the position crossed by the light path 80X, the slit light beam along this path 80X is allowed to pass through and reflected by the mirror 51X to project slit line images in the X-direction. At this moment, the other light path 80Y is blocked by the disk 73 and no slit light beam can reach the target surface to project thereon any slit line images in the Y-direction. After the disk 73 makes a half revolution and when the shutter window 84 comes to the position where the slit light beam 80Y crosses the disk 73, the beam is allowed to pass through to the mirror 51Y, is reflected thereby and projects slit line images in the Y-direction. At this moment, the other light path 80X is blocked by the disk 73 and no slit light beam can reach the target surface to project thereon any slit line images in the X-direction.

Operation of the shutter system described above is explained next by way of the flow chart shown in FIG. 26 and the timing chart shown in FIG. 27. As explained above and shown in FIG. 27, the two photoswitches 88 and 89 of the position sensor 74 (Sensor X and Sensor Y) transmit signals alternately. When one of such sensor signals S is received (#1), it is determined which of the light paths 80X and 80Y is open (#2) and image data are accumulated by the image receiving device 6 during one field period. Depending upon whether slit line images along the X- or Y-direction have been received, the received image data are stored either in areas for vertical (V) image data (#3) or in areas for horizontal (H) image data (#7) within the memory device 61. When the storage period comes to an end, a termination signal is outputted (#4 or #8) and image data from slit light image in the other direction are received (#5 or #9). At this moment, image data from slit light images in both X- and Y-directions are stored in the memory device 61. When a second termination signal is outputted from the memory (#6 or #10) to thereafter indicate the end of another storage period, the control unit 9 begins to process the stored image data (#12) as explained above. At the same time, the system begins to wait for the next input of a signal from the position sensor 74 and when a signal is received from the position sensor 74 (#15), the system waits for a predetermined period of time $T_A$ as explained above and the signal generation circuit 75 retransmits a video synchronizing signal (#16). Although this restarting of a video synchronizing signal is restricted by the rotation of the motor 81, the motor 81 has only to be started once if a high-accuracy motor is used. Since motors with high rotary accuracy are expensive, a preferable method is to use an inexpensive motor and to increase the number of starts. FIGS. 28A–28E show the angular positions of the disks 73 at various moments I, II, III, IV and V in the cycle of its operation shown in FIG. 27. The timing chart of FIG. 27 should be compared with a corresponding chart for a prior art system using an ires-type mechanical lens shutter. The comparison clearly shows that the shutter system of the present invention is much speedier.

What is claimed is:

1. An apparatus for inspecting components mounted on a circuit board comprising
    light source means for causing a plurality of slit light beams to be made incident on a circuit board diagonally from above, said light source means including a first source unit for projecting slit light images in a first direction on said circuit board and a second source unit for projecting slit light images in a second direction on said circuit board, said first and second directions being different,
    image receiving means for receiving said slit pattern images formed on said circuit board, and
    image processing means for generating data on positions of components mounted on said circuit board by receiving image signals from said image receiving means.

2. The apparatus of claim 1 further comprising
    input means for receiving a series of input data inclusive of fields of vision of said image receiving means, sizes, positions and orientations of said mounted components on said circuit board and maximum allowable positional errors,
    means for determining viewing positions at which said image receiving means is to be set above said circuit board such that target components to be inspected are viewable by said image receiving means,
    means for determining for each one of said viewing positions allowable positional ranges for those of said target components viewable by said image receiving means from said one of said viewing positions, and
    means for determining a sequence in which said image receiving means is moved from one to another of said viewing positions.

3. The apparatus of claim 1 wherein said light source means include a first source unit for projecting slit light images in a first direction on said circuit board and a second source unit for projecting slit light images in a second direction on said circuit, said first and second directions being different, each of said source units being comprised of
    a light emitter,
    a slit screen for receiving light from said light emitter and transmitting a plurality of mutually parallel slit light beams,
    a mirror for reflecting said plurality of slit light beams to direct said slit light beams to said circuit board, and
    means for adjustably varying the orientation of said mirror for changing the projection angle at which said slit light beams are projected onto said circuit board.

4. The apparatus of claim 3 wherein each of said source units is further comprised of
    a converging lens disposed between said light emitter and said slit screen to project a beam of light from said light emitter onto said slit screen, and
    a focusing lens disposed between said slit screen and said mirror to focus said slit light beams on said circuit board.

5. The apparatus of claim 3 wherein said first and second directions of substantially perpendicular to each other.

6. The apparatus of claim 1 wherein said light source means include a first source unit for emitting slit light beams along a first light path to project slit light images in a first direction on said circuit board and a second source unit for emitting slit light beams along a second light path to project slit light images in a second direction on said circuit board, said first and second directions being different, and wherein said switching means include
    a disk having a window and rotatably supported at a position crossed by both said first and second light paths,
    a position sensor for detecting angular position of said window with respect to said disk as said disk rotates, and
    signal generation means for responding to a position signal received from said position sensor by transmitting a command signal to said image receiving means to cause said image receiving means to receive image data from said circuit board when said slit light images in said first or second direction are projected on said circuit board.

7. A method of inspecting whether components are correctly mounted on a circuit board comprising the steps of
    exposing said mounted circuit board to a plurality of slit line beams from light source means and made incident diagonally from above by switching said light source means on and off,
    receiving image data of said mounted circuit board when slit line images are projected on said mounted circuit board by said slit line beams,
    defining frames on said circuit board with respect to intended positions of said components,
    determining actual positions of said components by analyzing said image data, and
    determining whether said components are properly mounted or not by comparing said detected actual positions and positions of said frames.

8. The method of claim 7 further comprising the step of storing said image data, said step of determining actual component position including the steps of
    selecting with reference to said stored image data a center point of one of said slit line images,
    considering an inspection area including said center point near one edge thereof,
    setting a threshold value regarding brightness of image,
    making a comparison between brightness of image at the opposite edge of said inspection area and said threshold value, and
    identifying an edge position of one of said components from the results of said comparison.

9. The method of claim 7 wherein said slit line beams are projected onto said circuit board in two directions which are substantially perpendicular to each other.

10. The method of claim 9 wherein said slit line beams projected into said two different directions are projected alternately.

* * * * *